(12) United States Patent
Xiao et al.

(10) Patent No.: US 10,393,785 B2
(45) Date of Patent: Aug. 27, 2019

(54) OPTICAL SENSING DEVICE FOR TWO-DIMENSIONAL ELECTRIC FIELD MEASUREMENT

(71) Applicant: ZHEJIANG UNIVERSITY, Hangzhou, Zhejiang Province (CN)

(72) Inventors: Kang Xiao, Hangzhou (CN); Xiaofeng Jin, Hangzhou (CN); Xianmin Zhang, Hangzhou (CN); Hao Chi, Hangzhou (CN); Shilie Zheng, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 15/765,246

(22) PCT Filed: Jan. 22, 2016

(86) PCT No.: PCT/CN2016/071722
§ 371 (c)(1),
(2) Date: Mar. 30, 2018

(87) PCT Pub. No.: WO2017/054374
PCT Pub. Date: Apr. 6, 2017

(65) Prior Publication Data
US 2018/0284174 A1    Oct. 4, 2018

(30) Foreign Application Priority Data

Sep. 30, 2015    (CN) .......................... 2015 1 0640325

(51) Int. Cl.
*G01R 31/00*    (2006.01)
*G01R 29/08*    (2006.01)
(Continued)

(52) U.S. Cl.
CPC .......... *G01R 29/0885* (2013.01); *G01R 29/12* (2013.01); *G02F 1/225* (2013.01); *G02F 2001/212* (2013.01)

(58) Field of Classification Search
CPC .... G01R 29/10; G01R 29/12; G01R 29/0885; G01R 29/0871; G01R 29/02; G01R 15/24;
(Continued)

(56) References Cited

U.S. PATENT DOCUMENTS 5,076,655 A * 12/1991 Bridges ................. G02F 1/0356
343/824
5,227,715 A * 7/1993 Ito ......................... G01R 15/247
250/225

(Continued)

*Primary Examiner* — Thang X Le
(74) *Attorney, Agent, or Firm* — Jiwen Chen

(57) ABSTRACT

An optical sensing device applicable to two dimensional electric field, includes sequentially connected input polarization maintaining fibers, a sensing unit, an output single mode fiber, a photodetector and a signal processing unit, the sensing unit includes a lithium niobate substrate; a first Y optical waveguide and two Mach Zehnder structure optical waveguides are arranged on the lithium niobate substrate; the input of the first Y optical waveguide is connected with the output of the laser source, the output is respectively connected to the inputs of the two Mach Zehnder structure optical waveguides; the outputs of the two Mach Zehnder structure optical waveguides are connected to the photodetector; dipole antenna is arranged at any single waveguide arm of each Mach Zehnder structure optical waveguide, the polarization directions of the two dipole antennas are in orthogonality with each other. The invention realizes measurement of two dimensional electric field utilizing one sensing head device, which has the benefits of high sensitivity, high measuring accuracy and easy processing.

5 Claims, 2 Drawing Sheets

(51) Int. Cl.
*G01R 29/12* (2006.01)
*G02F 1/225* (2006.01)
*G02F 1/21* (2006.01)

(58) Field of Classification Search
CPC . G01R 15/241; G02F 2001/212; G02F 1/225; G02F 2203/02; G02F 2201/16; H04B 10/516; H04B 10/532; H04B 10/5051; H04B 10/548; H04B 10/25752
See application file for complete search history.

(56) References Cited

U.S. PATENT DOCUMENTS

| | | | | |
|---|---|---|---|---|
| 5,799,116 | A * | 8/1998 | Yamamoto | H04B 10/114 |
| | | | | 385/12 |
| 5,907,426 | A * | 5/1999 | Kato | G01D 3/028 |
| | | | | 359/239 |
| 6,950,579 | B2 * | 9/2005 | Ahn | G02F 1/065 |
| | | | | 385/3 |
| 8,879,873 | B2 * | 11/2014 | Goh | H04B 10/5161 |
| | | | | 385/3 |
| 2016/0248515 | A1 * | 8/2016 | Zheng | H04J 14/06 |

* cited by examiner

OPTICAL SENSING DEVICE FOR TWO-DIMENSIONAL ELECTRIC FIELD MEASUREMENT

This is a U.S. national stage application of PCT Application No. PCT/CN2016/071722 under 35 U.S.C. 371, filed Jan. 22, 2016 in Chinese, claiming priority of Chinese Application No. 201510640325.0, filed Sep 30, 2015, all of which are hereby incorporated by reference.

TECHNICAL FIELD

The present invention belongs to photoelectronic technical field, specifically relates to an optical sensing device applicable to two dimensional electric field measurement.

BACKGROUND ART

As more and more electronic devices are being used, electromagnetic interference is getting more and more serious, greatly affecting the application of other devices. Therefore, it has become really necessary to measure the electric field distribution around a device and take anti-interference measures. Conventional electric field measuring system adopts an electrical active metal sensor. However, the metal parts of the electrical sensor, such as the metal probe and coaxial cable, can cause serious distortion to the electric field to be measured, resulting in high measurement result error. Besides, the actual electric field interference generally covers wide band from several kHz to tens of GHz. In addition, the conventional electrical sensor can operate only at a certain frequency point within a narrow range, which limits its measuring bandwidth. In order to overcome the limitation of the conventional electrical sensor, researchers have utilized crystal with linear electro-optical effect, such as lithium niobate to make an integrated optical electric field sensor, which has the advantages of high sensibility, wide bandwidth, and small footprint.

Currently, research on integrated optical electric field sensor primarily focuses on one dimensional measurement, which is only applicable to clear measurement of the electric field direction. However, the actual direction of the electric field to be measured is generally unknown. If the polarization direction of the antenna of the sensor is inconsistent with the direction of the electric field to be measured, the electric field amplitude obtained from the measurement is the projection of the actual electric field in the polarization direction of the antenna, which cannot accurately reflect the amplitude information of the actual electric field. Even if the direction of the electric field to be measured has been known, the electric field to be measured can be a variable field, of which the direction may change anytime, and it's impracticable to manually change the layout direction of the sensor either.

Therefore, only when an electric field sensor can measure electric field with more than one dimension, it can satisfy the requirement of actual electric field measurement. Parallel plane electric field and spherical surface electric field are the examples of two dimensional electric field. For example, Chinese patent application No.201210348311.8 discloses an integrated electric field sensor based on common path interference, comprising a lithium niobate substrate, a silicon substrate, a shim, a detecting unit and a modulating unit, wherein the lithium niobate substrate and silicon substrate are connected with each other through an ultraviolet curing adhesive, and are respectively connected with the shim through the ultraviolet curing adhesive. The detecting unit comprises two upper contact electrodes, a connecting conductor and two dipole antennas; the modulating unit comprises two lower contact electrodes, an optical waveguide and two modulating electrodes. In that patent, the construction of the integrated electric field sensor is complex with high measurement error and low measurement accuracy.

SUMMARY OF THE INVENTION

To overcome the shortcomings of the prior art, the present invention provides an optical sensing device applicable to two dimensional electric field measurement with high sensibility and high accuracy, realizing vector measurement of two dimensional electric field with one sensing head only.

An optical sensing device applicable to two dimensional electric field measurement, comprising a laser source, input polarization maintaining fibers sequentially connected to the laser source, a sensing unit, an output single mode fiber, a photodetector and a signal processing unit, the sensing unit comprises:

a lithium niobate substrate;

a first Y optical waveguide and two Mach Zehnder structure optical waveguides are arranged on the lithium niobate substrate; the input of the first Y optical waveguide is connected with the output of the laser source through an input polarization maintaining fibre, the output is respectively connected to the inputs of the two Mach Zehnder structure optical waveguides; the outputs of the two Mach Zehnder structure optical waveguides are connected to the photodetector through an output single mode fiber; the dipole antenna is arranged at any single waveguide arm of each Mach Zehnder structure optical waveguide, the polarization directions of the two dipole antennas are in orthogonality with each other.

Preferably, the lithium niobate substrate is made of lithium niobate crystals, with the orientation of the lithium niobate crystals x-cut (perpendicular to the crystal surface) y propagating.

In actual making, a one-to-two first Y optical waveguide and two Mach Zehnder structure optical waveguides are formed through Ti-diffusion or proton exchange on the lithium niobate crystal surface, the one-to-two first Y optical waveguide is a Y waveguide with equally divided power, with the two outputs of the first Y optical waveguide respectively connected with the Mach Zehnder structure optical waveguides, and tapered dipole antennas are respectively arranged at the single waveguide arm of the two Mach Zehnder structure optical waveguides. Preferably, the Mach Zehnder structure optical waveguides comprise two second Y optical waveguides and two parallel straight waveguides, with the branches of the two second Y optical waveguides respectively connected to the two parallel straight waveguides.

Preferably, the two dipole antennas are tapered antennas, with the intersection angles between the axial directions of the two tapered antennas and the corresponding straight waveguide transmission directions at 45° and 135°, respectively. The dipole antennas are tapered in structure, one of which is designed to be at inclination angle of 45°, i.e., the axial direction of the antenna respect to the base has an included angle of 45°, the other dipole antenna is designed to be at inclination angle of 45°, i.e., the axial direction of the antenna respect to the base has an included angle of 135°, with the polarization directions of the two dipole antennas orthogonal with each other.

Preferably, each dipole antenna comprises two triangular sub-blocks respectively arranged at the two sides of the optical waveguide symmetrical to the centerline, with the bases of the two sub-blocks parallel to the corresponding straight waveguide transmission directions, and the centerline of the two bases constitutes the said axis.

Preferably, the two dipole antennas are mirror symmetrical in structure.

In this invention, the laser source is a highly stable light source outputting linearly polarized lights, such as a semiconductor laser.

In the present invention, the sensitivity and response bandwidth of the sensing device is related to the size of the dipole antennas, such as space between antennas, antenna width and height. The material of the dipole antenna is metal, such as gold.

Preferably, the signal processing unit is used to process the electrical signals from the output of the two photodetectors: to identify frequency, to synthesize vector amplitudes, and to calculate directions. The DSP (digital signal processors) or FPGA (field-programmable gate array) can be adopted.

An optical sensing device for two dimensional electric field measurement proposed by the present invention realizes two dimensional electric field measurement with high sensitivity, high accuracy and easy processing, of which the sensing unit is simple in structure and has mature manufacturing process applicable to electric field measurement for electromagnetic compatibility and impulse etc.

1. Laser source; 2. Input polarization maintaining fiber; 3. Sensing unit; 4. Lithium niobate substrate; 5. First Y optical waveguide; 6. Mach Zehnder structure optical waveguide; 7. First dipole antenna; 8. Second dipole antenna; 9. Output single mode fiber; 10. Photodetector; 11. Signal processing unit.

SPECIFIC EMBODIMENTS OF THE PRESENT INVENTION

Figure 1:
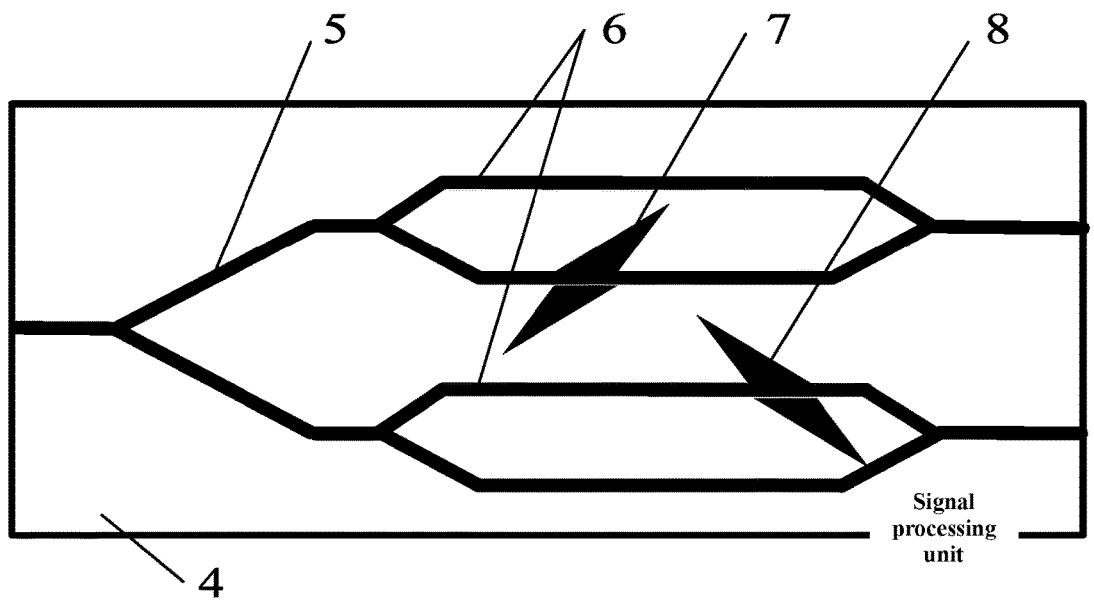
FIG. 1 is the structure illustration of an optical sensing device applicable to two dimensional electric field measurement in one embodiment of the present invention.
Figure 2:
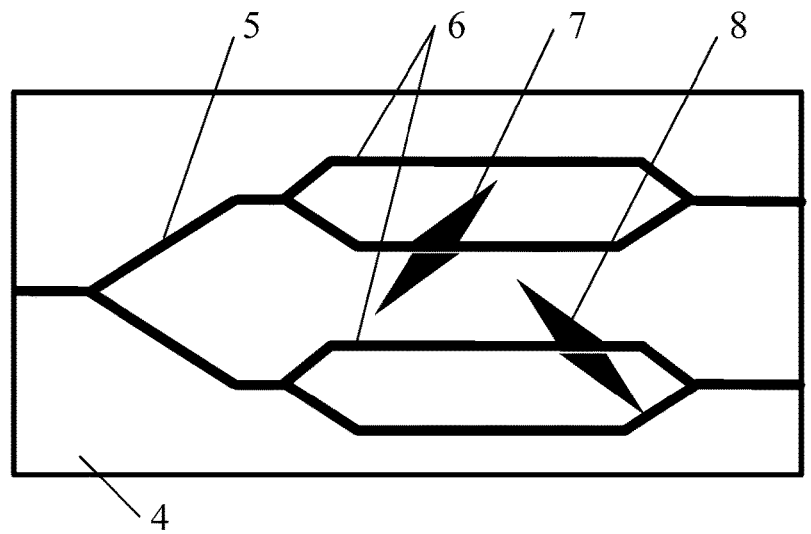
FIG. 2 is the structure illustration of the sensing unit of the sensing device in one embodiment of the present invention.
Figure 3:
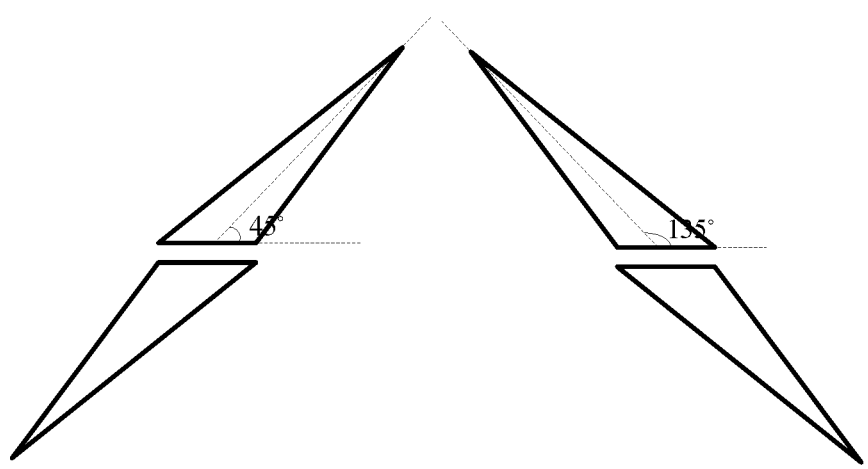
FIG. 3 is the structure illustration of two dipole antennas in the sensing unit.

Detailed description of an optical sensing device applicable to two dimensional electric field measurement proposed by the present invention is given below in combination with figures and specific embodiments:

An optical sensing device applicable to two dimensional electric field measurement in this embodiment is as shown in FIGS. 1-3, comprising a laser source 1, input polarization maintaining fibers 2, a sensing unit 3, an output single mode fiber 9, a photodetector 10 and a signal processing unit 11:

Wherein the outputs of laser source 1 are connected to the inputs of the sensing unit 3 sequentially through input polarization maintaining fibers 2, the two outputs of the sensing unit are respectively connected to the inputs of two photodetectors 10 through two output single mode fibers 9, and the outputs of the photodetectors 10 are connected to the signal processing unit 11.

The laser source 1 is a highly stable light source outputting linearly polarized lights, such as a semiconductor laser.

The sensing unit 3 takes lithium niobate crystals as a substrate, i.e., a lithium niobate substrate 4, a one-to-two first Y optical waveguide 5 and two Mach Zehnder structure optical waveguides 6 are formed through Ti-diffusion or proton exchange on the lithium niobate substrate surface, the inputs of first Y optical waveguide 5 are connected to the outputs of laser source 1 through input polarization maintaining fibers 2, with the two outputs of the first Y optical waveguide 5 respectively connected with the inputs of Mach Zehnder structure optical waveguides 6, and tapered dipole antennas are respectively arranged at the single waveguide arm of the two Mach Zehnder structure optical waveguides 6.

The orientation of the lithium niobate crystals is x-cut y propagating (perpendicular to the crystal surface) direction light transmission.

The Mach Zehnder structure optical waveguides 6 comprise two second Y optical waveguides and two parallel straight waveguides, with the branches of the two second Y optical waveguides respectively connected to the two parallel straight waveguides.

The dipole antennas come in two, both in a tapered structure. The axial direction of first dipole antenna 7 is in 45° angle to the base, with the polarization direction at 45°, the highest electric field response is in the polarization direction, whereas the electric field response is relatively weak in the direction perpendicular to the polarization direction, of which the effect can be ignored. The axial direction of second dipole antenna 8 is in 135° angle to the base, with the polarization direction at 45°, the highest electric field response is in the polarization direction, whereas the electric field response is relatively weak in the direction perpendicular to the polarization direction, of which the effect can be ignored. The polarization directions of first dipole antenna 7 and second dipole antenna 8 are mutually orthogonal to each other, and they have the highest electric field responses in their respective polarization directions, but have the weakest electric field response in each other's polarization directions, of which the effect can be ignored. Therefore, the two components of the vectors of two dimensional electric field mutually orthogonal to each other can be measured simultaneously and independently, and the electric field components respectively measured by the two antennas can be vectorially synthesized finally, and the vector amplitudes of two dimensional electric field measured can be obtained.

The sensitivity and response bandwidth of the sensing device is related to the size of the dipole antennas, such as space between antennas, antenna width and height. The material of the dipole antenna is metal, such as gold.

The signal processing unit 11 is used to process the electric signals from the outputs of the two photodetectors: to identify frequency, to synthesize vector amplitudes, and to calculate directions. DSP or FPGA can be adopted.

The operation principle of the present invention is as follows:

The linearly polarized light from the outputs of the laser source is transmitting through the polarization maintaining fiber and is coupled into the electric field sensing unit, the light wave is transmitting in TE mode in the optical waveguide of the electric field sensing unit. The light wave is divided into two portions with equal power after going through first Y optical waveguide, with the two portions of lights respectively entering Mach Zehnder optical waveguides.

When there is no incident electric field, after being transmitting through the two asymmetric Mach Zehnder optical waveguides, interference occurs to light composing, and the output optical power is a constant value. When there is an incident electric filed E on the upper surface of the lithium niobite, which is the same as the antenna in polarization direction, the antennas receive the electric field and generate induced voltage V on the two antennas, and the induced voltage forms electric field within the effect area of the antennas and the waveguides to affect the optical waveguides. The electric field between the electrodes changes the refractive index that affects the optical waveguides, hence changing the phase of the light wave in the optical waveguides. The phase difference between the light waves of the upper and lower waveguide arms is changed, intervention occurs to light wave composing, the output optical power is changed.

The transmission function of Mach Zehnder structure optical waveguide is expressed as:

$$P = A\left[1 + b\cos\left(\varphi_0 + \frac{V}{V_\pi}\pi\right)\right]$$

Wherein, P is the optical power output by Mach Zehnder structure optical waveguide; A is the peak optical power output by Mach Zehnder structure optical waveguide, which is related to light source power and transmission loss etc.; b is the extinction ratio of Mach Zehnder structure optical waveguide; $\varphi_0$ is the inherent phase difference between the upper and lower arms of Mach Zehnder structure optical waveguide; V is the induced voltage between electrodes, hence V=k·E, k is a constant, E is an incident electric field. $V_\pi$ is a half-wave voltage of Mach Zehnder structure optical waveguide, expressed as $$V_\pi = \frac{\lambda_0 \cdot \text{Gap}}{\Gamma \cdot n_e^3 r_{33} \cdot L}$$

Wherein, $\lambda_0$ is wave length in vacuum; Gap is space between antennas; $\Gamma$ is electro-optic overlap factor, $n_e$ is extraordinary light refractive index; $r_{33}$ is the electro-optic coefficient of the optical waveguide; L is the length of the effect area of the antenna and the optical waveguide.

The unknown parameters in the above formula can be calibrated through standard electric field.

The two dimensional electric field in the plane can be divided into any combination of two electric field components perpendicular with each other, wherein the polarization direction of the antenna of one of the Mach Zehnder structure optical waveguides is 45°, modulated by the electric field at the angle of 45°; the polarization direction of the antenna of another Mach Zehnder structure optical waveguide is 135°, modulated by the electric field at the angle of 135°. The modulated optical waves output by the two Mach Zehnder structure optical waveguides are converted into corresponding electrical signals respectively via the photodetector, then the orthogonal components of the electric field at 45° and 135° are calculated by the signal processing unit and are vectorially synthesized to obtain the amplitude, direction and frequency of the vector electric field to be measured.

The invention claimed is:

1. An optical sensing device applicable to two dimensional electric field measurement, comprising a laser source, input polarization maintaining fibers sequentially connected to the laser source, a sensing unit, an output single mode fiber, photodetector and signal processing unit, which is characterized in that the sensing unit comprises:
   a lithium niobate substrate;
   a first Y optical waveguide and two Mach Zehnder structure optical waveguides are arranged on the lithium niobate substrate; an input of the first Y optical waveguide is connected with an output of the laser source, the outputs of the first Y optical waveguide are respectively connected to the inputs of the two Mach Zehnder structure optical waveguides; the outputs of the two Mach Zehnder structure optical waveguides are connected to the photodetectors; dipole antenna is arranged at any single waveguide arm of each Mach Zehnder structure optical waveguide, the polarization directions of the two dipole antennas are in orthogonality with each other;
   the Mach Zehnder structure optical waveguides comprise two second Y optical waveguides and two parallel straight waveguides, with the branches of the two second Y optical waveguides respectively connected to the two parallel straight waveguides;
   each dipole antenna comprises two triangular sub-blocks respectively arranged at the two sides of the optical waveguide symmetrical to the centerline, with the bases of the two sub-blocks parallel to the corresponding straight waveguide transmission directions, and the centerline of the two bases constitutes the axis.

2. The optical sensing device applicable to two dimensional electric field measurement according to claim 1, which is characterized in that: the lithium niobate substrate is made of lithium niobate crystals, the orientation of the lithium niobate crystals is x-cut y propagating.

3. The optical sensing device applicable to two dimensional electric field measurement according to claim 1, which is characterized in that: the two dipole antennas are tapered antennas, with the intersection angles between the axial directions of the two tapered antennas and the corresponding straight waveguide transmission directions at 45 degree and 135 degree respectively.

4. The optical sensing device applicable to two dimensional electric field measurement according to claim 1, which is characterized in that: the two dipole antennas are mirror symmetrical in structure.

5. The optical sensing device applicable to two dimensional electric field measurement according to claim 1, which is characterized in that: the signal processing unit is DSP (digital signal processors) or FPGA (field-programmable gate array).

* * * * *